United States Patent [19]

Braden

[11] Patent Number: 5,073,521
[45] Date of Patent: Dec. 17, 1991

[54] METHOD FOR HOUSING A TAPE-BONDED ELECTRONIC DEVICE AND THE PACKAGE EMPLOYED

[75] Inventor: Jeffrey S. Braden, Milpitas, Calif.

[73] Assignee: Olin Corporation, New Haven, Conn.

[21] Appl. No.: 436,854

[22] Filed: Nov. 15, 1989

[51] Int. Cl.⁵ ............................................. H01L 21/60
[52] U.S. Cl. .................................. 437/209; 437/215; 437/216; 437/217; 437/218; 437/219; 437/220; 357/70; 357/80; 357/81
[58] Field of Search .............. 437/209, 215, 216, 217, 437/218, 219, 220; 357/70, 71, 72, 74, 80, 81

[56] References Cited

U.S. PATENT DOCUMENTS

| 4,132,856 | 1/1979 | Hutchison . | |
|---|---|---|---|
| 4,209,355 | 6/1980 | Burns . | |
| 4,234,666 | 11/1980 | Gursky . | |
| 4,461,924 | 7/1984 | Butt . | |
| 4,489,857 | 7/1989 | Butt et al. . | |
| 4,607,276 | 8/1986 | Butt . | |
| 4,684,975 | 8/1987 | Taklar et al. . | |
| 4,701,781 | 10/1987 | Sankhagowit . | |
| 4,721,993 | 1/1988 | Walter . | |
| 4,729,010 | 3/1988 | Tsuchiya et al. | 357/80 |
| 4,736,236 | 4/1988 | Butt . | |
| 4,769,345 | 9/1988 | Butt et al. . | |
| 4,805,009 | 2/1989 | Pryor et al. . | |
| 4,806,409 | 2/1989 | Walter et al. . | |
| 4,812,896 | 3/1989 | Rothgery et al. . | |
| 4,816,426 | 3/1989 | Bridges et al. . | |
| 4,827,376 | 5/1989 | Voss | 361/389 |
| 4,859,614 | 8/1989 | Sugahara et al. . | |
| 4,888,449 | 12/1989 | Crane et al. . | |
| 4,897,508 | 1/1990 | Mahulikar et al. . | |
| 4,908,086 | 3/1990 | Goodrich et al. . | |
| 4,926,242 | 5/1990 | Itoh et al. | 357/81 |
| 4,939,316 | 7/1990 | Mahulikar et al. | 29/827 |
| 4,961,106 | 10/1990 | Butt et al. . | |

FOREIGN PATENT DOCUMENTS 56-7453 1/1981 Japan .
58-124248 7/1983 Japan .
2-66961 3/1990 Japan .

OTHER PUBLICATIONS

Paper presented at ISHM 1982, Nov. 15–17, Reno, Nev., by: Robert F. Unger, Eugene P. Kelley, Carmen Burns, "Hermetic Tape Carrier—A New High Density Leaded Ceramic Chip Carrier".

Primary Examiner—Brian E. Hearn
Assistant Examiner—Kevin M. Picardat
Attorney, Agent, or Firm—Gregory S. Rosenblatt; Paul Weinstein

[57] ABSTRACT

A method for the assembly of an adhesively sealed tape package having base and cover components is provided. An electronic device is first bonded to the inner leads of a tape leadframe. The chip on tape is then disposed between the base component and the cover component and adhesively sealed to both. The electronic device and a portion of the inner leads are thereby encapsulated. In one embodiment the base and cover components are an aluminum base alloy having an anodization layer over at least those surfaces exposed to the external environment of the adhesive.

17 Claims, 2 Drawing Sheets

METHOD FOR HOUSING A TAPE-BONDED ELECTRONIC DEVICE AND THE PACKAGE EMPLOYED While the invention is subject to a wide range of applications, it is particularly suited for the assembly of a metal package for housing an integrated circuit device. In particular, the invention relates to a method for encasing a semiconductor device within an adhesively sealed metal package.

Integrated circuit devices are typically manufactured from a semiconductor material, for example, silicon, germanium or gallium/arsenide. The semiconductor material is fashioned into a die, a generally rectangular structure having circuitry formed on one surface. Along the periphery of this surface are input/output pads to electrically interconnect the device to external circuitry.

The semiconductor device requires protection from moisture and mechanical damage. This protection is provided by the package. The package further contains an electrically conductive means to transport electrical signals between the semiconductor device and the external circuitry.

The conductive means is traditionally a leadframe. The leadframe is formed from a conductive metal or metal alloy such as copper or an iron-nickel base alloy. The thickness is usually about 0.010 inches, although thicknesses of from about 0.005 inches to about 0.020 inches are used. The leadframe is stamped or etched to include a plurality of leads. The leads are electrically interconnected to the input/output pads of the semiconductor device by bond wires.

Metal stamping rules dictate that the distance between leads cannot be much less than the thickness of the leads. For a leadframe formed from 0.010 inch metal strip stock, the minimum lead pitch is about 0.020 inches made up of 0.010 inches wide leads separated by 0.010 inch spacing. Due to space contraints, conventional DIP (dual-in-line) leadframes contain a maximum of about 64 leads. Quad leadframes, with leads approaching the device from all four sides, contain up to about 250 leads. As devices becomes more complex, a larger number of input/output pads are required. When several hundred sites are required, conventional leadframes are not satisfactory.

One method to increase the lead density is through the use of tape automated bonding (TAB) leadframes. TAB leadframes are disclosed in U.S. Pat. Nos. 4,209,355 issued to Burns and 4,234,666 to Gursky. There are three general forms of TAB construction. The first is a single layer or all metal construction. Second is a two layer construction comprising a metal layer with a dielectric backing. A three layer construction comprises the metal layer adhesively bonded to the dielectric backing. An alignment means such as sprocket holes provides accurate positioning of the leads.

The metal foil layer (or layers for a multi-metal layer leadframe) is bonded to a dielectric carrier. The dielectric carrier is typically a polyimide such as Kapton, manufactured by Dupont. The foil is patterned into a plurality of leads by photolithographic techniques. Briefly, this process entails applying a photosensitive resist over the foil. A mask defining the desired circuit pattern is placed over the resist. A light source exposes those areas not shielded by the mask. The photoresist polymerizes in the exposed regions becoming resistant to a first solvent. The photoresist which did not polymerize is removed by dissolution in the first solvent. The exposed metal foil is then etched using a suitable acid or combination of acids to expose the underlying carrier layer.

After rinsing the acid etchant, a second solvent removes the polymerized resist by dissolution leaving metal circuit traces in the desired lead pattern supported by the carrier layer. The photolithographic process may use either a positive or a negative photoresist as known in the art.

The metal foil layer is quite thin and has a low internal resistance. Copper or a high conductivity copper alloy is preferably used. The foil should have a conductivity of approximately 100 percent IACS (International Annealed Copper Standard where "pure" copper has a value of 100 percent).

The thickness of the copper foil layer is from about 0.0005 to about 0.006 inches. Usually, the foil thickness is from about 0.0007 inches (known as ½ ounce copper) to about 0.0028 inches (known as 2 ounce copper).

Since the copper foil is much thinner than a conventional leadframe and supported by a dielectric layer, much finer geometries are obtained. Photolithographic techniques readily produce 2 mil leads with 2 mil spacings. The lead density achievable with a TAB leadframe is significantly higher than the lead density achieved with conventional leadframes.

TAB leadframes are electrically interconnected to an electronic device by bonding the inner leads of the foil to the input/output pads. Bonding is by thermosonics or thermocompression. The bonding may be done single point or by gang bonding. The electronic device and inner lead portion are then encased within a package to provide the necessary environmental and mechanical protection.

One method of package assembly is known as "chip on tape". In this method, an electronic device is bonded to the inner leads of a TAB leadframe. The device and inner leads are then encapsulated by molding within an epoxy resin. A chip on tape package is disclosed in U.S. Pat. Nos. 4,684,975 to Takier et al and 4,701,781 to Sankhagowit.

Alternatively, the chip on tape assembly is sealed within a ceramic package as described in an article entitled "Hermetic Tape Carrier—A New High Density Leaded Ceramic Chip Carrier" by Unger et al. The electronic device and bonded inner leads are sealed within a ceramic substrate and cap.

A disadvantage with molded plastic and ceramic tape packages is poor thermal dissipation. When an electric current is passed through the electronic device, heat is generated. The more complex the device, and the more input/output pads employed, the greater the heat generated. A means must be provided to remove heat from the electronic device. It has been determined that for each 10° C. rise in operating temperature, the effective life of the electronic device is decreased by 50%.

One tape package which addresses the thermal issue in U.S. Pat. No. 4,607,276 to Butt. The patent discloses a chip-on-tape configuration in which the electronic device and inner leads are sealed within a base and cover sealed together with a sealing glass. To maximize thermal conductivity, the package base and cover components may be manufactured from a glass sealable copper alloy, such as 63800 which has the nominal composition 95.0% by weight copper, 2.8% aluminum, 1.8% silicon and 0.4% cobalt as disclosed in U.S. Pat. No. 3,676,292 to Pryor et al.

A light weight adhesively sealed package is disclosed in U.S. Pat. No. 4,939,316 by Mahulikar et al. The patent discloses aluminum base alloy package components, which are anodized on at least those surfaces exposed to the environment.

To date, no one has provided a method for encapsulating an electronic device which is electrically interconnected to a TAB leadframe within anodized aluminum package components.

Accordingly, it is an object of the invention to provide a method for the assembly of a light weight, adhesively sealed package to encase an electronic device which is electrically interconnected to a TAB leadframe. It is a feature of the invention that the package includes discrete base and cover components. It is an advantage of the invention that to minimize package weight and to maximize thermal dissipation, either the base component or the cover component contacts the electronic device and is manufactured from aluminum or an aluminum-base alloy. Yet another advantage of the package of the invention is that thermal management of the electronic device is at the chip level, rather than at the module or system level. A further advantage of the package of the invention is it provides excellent mechanical protection to the electronic device. Still another advantage of the package of the invention is the device may be electrically tested prior to sealing.

Accordingly, there is provided a method for assembling a package to house an electronic device. The method comprises providing an electrically conductive interconnect tape having a plurality of leads. The leads each have an inner lead portion and an outer lead portion. The electronic device is bonded to each inner lead. The device and inner lead portion are disposed between a base component and a cover component, such that at least a portion of the outer lead portion of the interconnect tape extends beyond the base and cover components. The base component is then bonded to the cover component encapsulating both the electronic device and the inner leads.

The above stated, objects, features and advantages of the invention will become more apparent from the specification and figures which follow:

Figure 1:
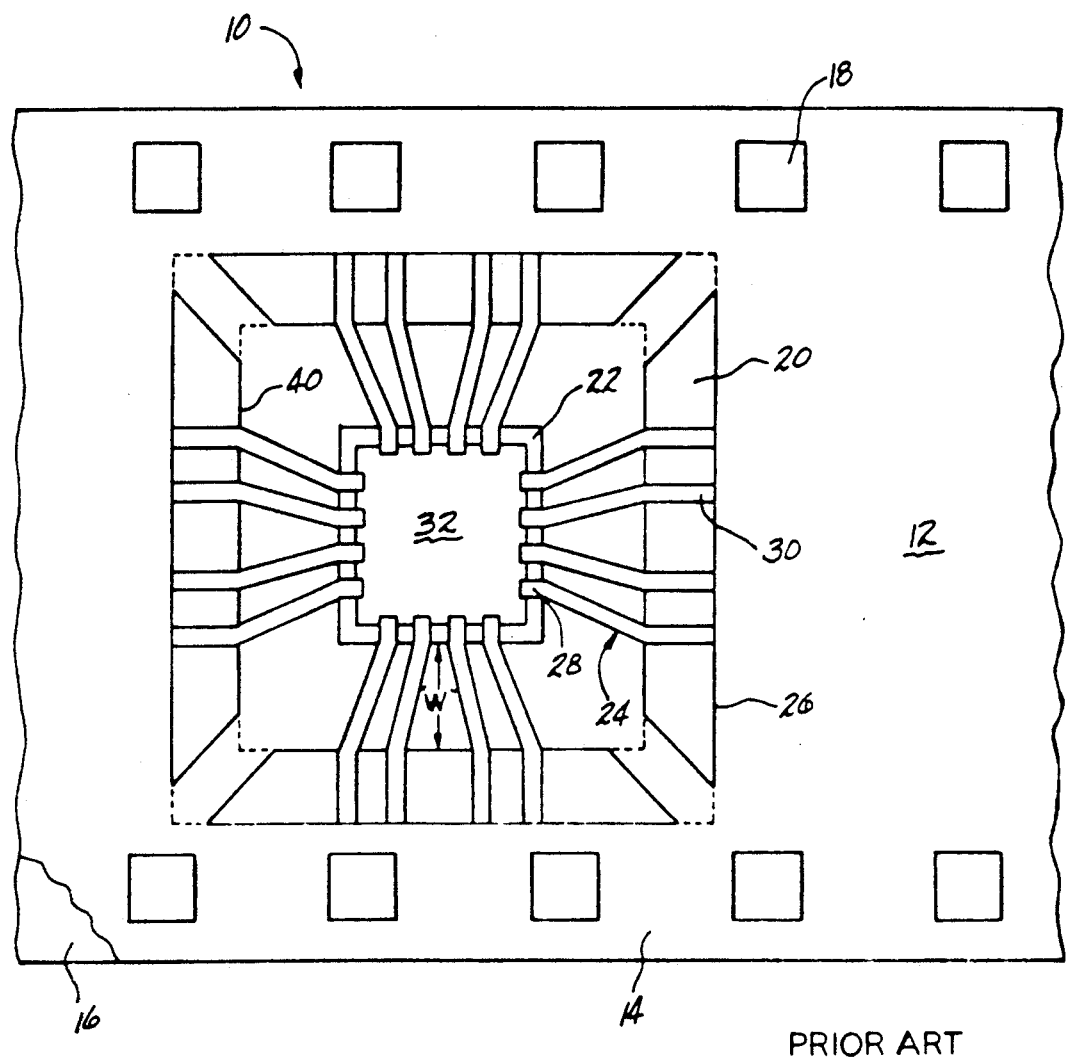
FIG. 1 shows in top, planar view an electronic device bonded to the inner leads of an interconnect tape as known in the prior art.

FIG. 1 illustrates in top planar view, a chip-on-tape assembly 10 as known in the prior art. The assembly 10 comprises an interconnect tape 12 having at least one electrically conductive layer 14 supported by a dielectric layer 16. The conductive metal layer 14 may be bonded directly to the dielectric layer 16, known in the art as a two-layer TAB tape, or an adhesive layer (not shown) may bond the dielectric layer 16 to the electrically conductive layer 14, as known in the art as a three-layer TAB leadframe.

The dielectric layer 16 may be any flexible non-electrically conductive material. One such material is a polyimide such as Kapton. The electrically conductive layer 14 is a high conductivity metal such as copper or a dilute copper base alloy such as C110 (nominal composition 99.90% by weight copper and 0.05% maximum oxygen). The dielectric layer 16 generally has a thickness of from about 0.001 inches to about 0.005 inches while the conductive layer 14 has a thickness of from about 0.0005 inches to about 0.006 inches and preferably from about 0.0007 inches to about 0.0028 inches.

Prior to bonding the metal foil layer by a process such as lamination, various features are formed in the dielectric layer 16. The features are formed by stamping, chemical etching, by chemical milling or other suitable technique. The features include sprocket holes 18, outer lead windows 20 and personality window 22.

The conductive metal layer 14 is bonded to the dielectric layer 16 and patterned by photolithographic techniques. Typically, the features will include sprocket holes 18, personality windows 22 and leads 24. While the alignment means is described in terms of sprocket holes 18, other indexing systems such as computer aided lead pattern recognition are also within the scope of the invention. The leads 24 extend from an external edge 26 of the outer lead windows 20 to the personality window 22. The inner lead ends 28, extend in cantilever fashion into the personality window 22.

The electronic device 32, which is usually a silicon based semiconductor integrated circuit device, is electrically interconnected to the inner lead ends 28 of the interconnect tape 12 forming the chip-on-tape assembly 10. Electrical interconnection is by conventional TAB bonding. Both single point and gang bonding may be employed using either thermosonic or thermocompression means. As may be seen more clearly in the cross-sectional representation of FIG. 2, the inner lead ends 28 are bonded to input/output pads 34 of the electronic device 32. To facilitate bonding, the input/output pads 34 may be raised metalized aluminum bumps. Alternatively, the inner lead ends 28 may include a gold or tin-lead solder bump. Copper bumps, plated or unplated, may also be included.

Figure 2:
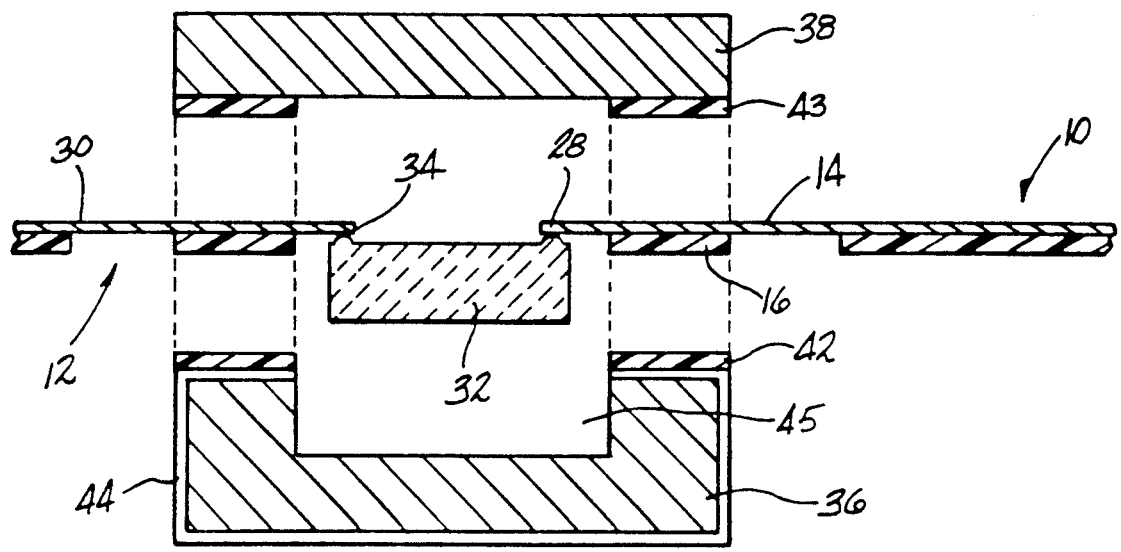
FIG. 2 shows in cross-sectional representation a method for housing an electronic device in accordance with the invention.

Referring to both FIGS. 1 and 2, the method of the invention is more fully detailed. A base component 36 and a cover component 38 are provided. The peripheral dimensions of the base and cover components are determined by the outer lead window 20. The peripheral dimensions of the components refers to the perimeter or boundary dimensions, that is the length and width. The peripheral dimension of the base and cover components is approximately equal to the dimensions defined by the inner lead edge line 40 of the outer lead window 20 as shown partially in phantom in FIG. 1.

A first bonding means 42 such as a first adhesive layer is disposed between the interconnect tape 12 and the base component 36. A second bonding means 43 which is preferably also an adhesive layer is disposed between the interconnect tape 10 and cover component 38. The bonding means is selected to be a dielectric material to provide electrical isolation between the leads 14 and metal or metal alloy base 36 and/or cover 38 components. If a non-conductive coating layer 44, such as anodized aluminum, is applied to the metal surfaces as detailed below, the requirement that the adhesive be a dielectric may be circumvented.

The polymer adhesive 42 may be any suitable thermoplastic or thermosetting polymer resin having a cure temperature less than the thermal degradation point of the dielectric carrier layer 14. For a polyimide carrier layer, this temperature is about 225° C. A preferred polymer adhesive 42 is a thermosetting polymer resin.

such as an epoxy. A typical epoxy cure cycle is heat to about 150° C. to about 200° C. for about 60 minutes.

The maximum adhesive width is equal to the distance between the inner edge line 40 and the perimeter of the personality window 22 as designated "W" in FIG. 1. Narrower adhesive widths may be used. However, sufficient adhesive must be provided to electrically isolate the leads 14.

As illustrated in FIG. 2, the chip-on-tape assembly 10 is disposed between base component 36 and the cover component 38. The electronic device 32 is positioned approximately in the center of the base component 36. While the base component 36 is illustrated as adapted to receive the electronic device 32 by inclusion of a cavity 45, formation of the cavity in the cover component 38 or both base and cover components is also within the scope of the invention. Further, neither component may include a cavity. The thickness of the first 42 and second 43 adhesive layers would provide sufficient space for the electronic device 32.

The dielectric layer 16 located between the personality window 22 and outer lead window 20 is positioned between the first 42 and second 43 adhesive layers. Positioning of the leads 14 and dielectric layer 16 is automated using the sprocket holes 18 or other indexing means.

One automated assembly process as shown in FIG. 2 comprises the base component 36 and cover component in opposition to one another with the perimeters in alignment. A first 42 epoxy ring with an outside diameter defined by the outer lead window line 40 and inside diameter defined by the personality window 22 is tacked to the base component 36. A similar second 43 epoxy ring is tacked to the cover component 38.

"Tack" is used in its common sense within the art, that is attached without completely curing the adhesive. One means to tack the adhesive is to heat both the base 36 and cover 38 components to a temperature of about 85° C. Heat is provided by an external source such as a heated fixture which accepts and positions the components. The tack temperature will make the epoxy stick to the components without initiating a complete cure reaction. Air is generally an acceptable atmosphere for all assembly operations. A protective blanket of nitrogen or other neutral or inert gas may be used if oxidation is a problem.

The base and cover components are then brought together. The first adhesive layer 42 tacks to the dielectric carrier layer 16. The second adhesive layer 43 tacks to both the leads 14 and the dielectric carrier layer 16 between leads.

The tacked assembly is then cured either by increasing the fixture temperature or by transferring the tacked assembly to a cure furnace. The epoxy is heated to an effective cure temperature, typically from about 150° C. to about 200° C. Pressure may also be applied to produce more uniform epoxy flow.

When the cure reaction is complete, the interconnect tape 10 is severed along the exterior edge 26 of the outer lead windows 20 as shown partially in phantom in FIG. 1. The outer leads 30 extend beyond the perimeter of the assembled package an are available for connection to external circuitry.

An advantage of the assembly process of the invention is the outer leads 30 are not severed until package assembly is complete. Continuous processes may be employed throughout. The chip on tape may be presented to the package components in strip, reel or carrier form. The assembled package may be transported to the cure site and lead severing site in the same format.

Either the base component 36 or cover component 38 is preferably in contact with the electronic device 32. Direct contact improves thermal dissipation of internally generated heat. To maximize thermal dissipation, that component in contact with the electronic device 32 is formed from a metal or metal alloy. The other component may be a ceramic, polymer or metal. Preferably, the base and cover components are selected to have coefficients of thermal expansion which are approximately equal so the assembled package will not behave as a bi-metallic strip and flex during thermal cycling.

The finished package includes a cavity which may be machined into either the base component 36 or cover component 38 or formed by the thickness of the first 42 and second 43 epoxy bonding rings. The electrically active face of the integrated circuit device is not in contact with the package as in a molded plastic tape package. As a result, less mechanical stress is applied to the chip when package components expand or contract during heating and cooling cycles.

The metal package components are preferably selected to be a metal having high thermal conductivity such as copper, aluminum and their alloys. Most preferably, an aluminum base alloy is selected. The thermal conductivity of an anodized aluminum alloy base component has been measured to be about equal to that of a similar copper base. The weight of the aluminum alloy is only 60% that of copper. This weight advantage is beneficial in also reducing the weight the tape leads must support.

To minimize package corrosion, at least those surfaces of the aluminum alloy package components which are exposed to the external environment are coated with an anodization layer 44. Anodization layer 44 may extend to those surfaces in contact with the polymer adhesive bonding component 42. It has been found that anodization layer 44 increases the adhesion between polymer adhesive and the aluminum alloy package components.

If the package components are copper, a copper base alloy or other material which is not anodizable, the coating layer 44 may be a second metal such as an electrolytically deposited nickel coating as disclosed in U.S. Pat. No. 4,888,449 by Crane et al which is incorporated herein by reference. Also, certain alloys such as C63800 are capable of forming an in situ refractory oxide coating and the coating layer 44 may constitute that internally formed layer.

Figure 3:
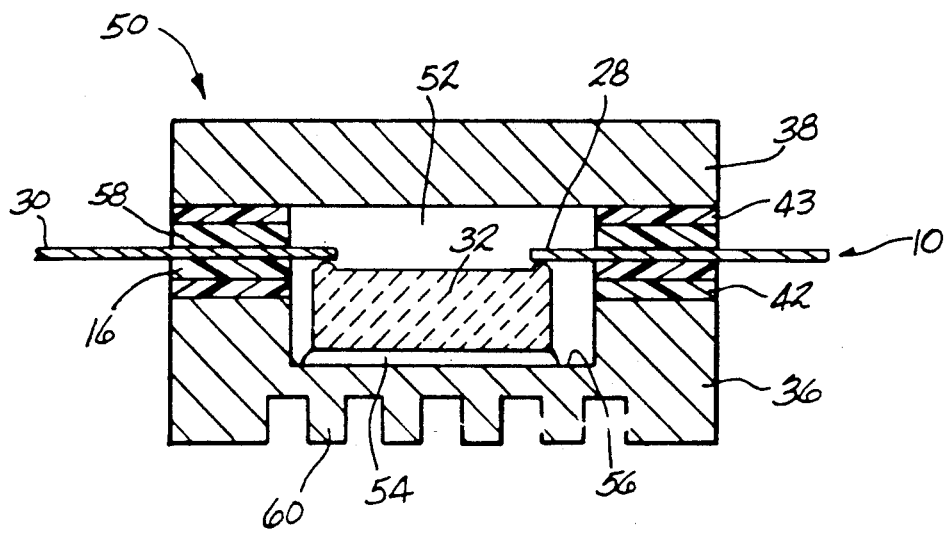
FIG. 3 shows in cross-sectional representation an electronic package manufactured in accordance with the method of the invention.

FIG. 3 shows in cross-sectional representation an electronic package 50 assembled according to the method of the invention. The package 50 is comprised of a base component 36 and a cover component 38. A tape leadframe which has been severed from the interconnect tape 10 is disposed between and bonded to both the base component 36 and the cover component 38. First 42 and second 43 bonding means which are preferably a non-conductive adhesive such as an epoxy bond the leadframe 10 to both the base and cover components.

The electronic device 32 has been previously electrically interconnected to the inner lead fingers 28 as described hereinabove. The electronic device 32 is encased within a cavity 52 formed when the base component 36 and cover component 38 are sealed together. It is within the scope of the invention to permit the electronic device to float freely within the cavity 52 supported only by the bond between the input/output pads 34 and inner lead fingers 28. A more preferred embodiment utilizes a thermally conductive die attach 54 to bond the electronic device 32 to one of the package components.

The thermally conductive die attach 54 may be electrically conductive if the electronic device is to be grounded through the metal base component 36. The conductive die attach may be a low melting metallic solder such as tin-lead, other tin based solder alloys or metal filled polymers such as silver filled epoxy or polyimide.

If the electronic device 32 is to be electrically isolated from the metal base component 36, an electrically insulating die attach such as a non-conductive epoxy may be used. The epoxy may be partially filled with a thermally conductive, electrically resistive powder such as silicon carbide or aluminum nitride to an extent sufficient to increase thermal conductivity while still maintaining the non-conductivity of the adhesive. Alternatively, if anodized aluminum package components are employed as disclosed above. an anodization layer (not shown) may be formed on the bonding surface 56 of the base component 36 to provide isolation.

The die attach 54 is deposited within the package base component 36 prior to assembling the package. The die attach 54 is selected to be a material which will bond at the same temperature as used to seal the adhesive 42, 43. In this way, when the package is assembled according to the method of the invention, the chip is simultaneously bonded to the surface 56 of the base component 36.

Copper catalyzes the degradation of some polymer adhesives. The polyimide layer 16 between the tape leadframe 10 and the first sealant means 42 for two and three layer tapes protects that layer from degradation. In one embodiment of the invention, a coating layer 58 is deposited on that portion of the tape leads 14 in contact with the second sealant means 43. The coating layer 58 may be any material which does not react with either epoxy or copper. For example. a second polyimide layer may form the coating layer 58. Alternatively, a plating layer such as gold, tin, nickel and alloys of these materials such as tin-lead may be deposited.

The outer lead ends 30 are usually plated prior to package assembly to facilitate soldering. A plating mask is employed to control the region to which the plate is applied. By changing the design of the mask, the portion of the leads 14 in contact with the second sealant means 43 may be coated during outer lead plating. Alternatively, since the package protects the integrated circuit device and inner leads from the plating solution, the outer leads may be plated subsequent to package assembly.

To increase thermal conduction through the package 50, fins 60 may be formed in the base component 36. The fins 60 increase the surface area of the base component 36 increasing the amount of heat removed by convection.

While the specification and figures have been described in terms of the two and three layer TAB tapes. the invention is applicable to and encompasses package designs and assembly processes employing the single metal layer configuration.

The patents, patent applications and publications set forth in the specification are intended to be incorporated by reference herein.

It is apparent that there has been provided in accordance with this invention a method for the assembly of a metal tape package which fully satisfies the objects, means and advantages set forth hereinbefore. While the invention has been described in combination with specific embodiments thereof, it is evident that many alternatives, modifications and variations would be apparent to those skilled in the art in light of the foregoing description. Accordingly, it is intended to embrace all such alternatives, modifications and variations as fall within the spirit and broad scope of the appended claims.

I claim:

1. A method for assembling a package to house an electronic device, comprising the steps of:
   providing an electrically conductive interconnect tape having a plurality of leads, each said lead having an inner lead portion extending in cantilever fashion about a centrally positioned aperture and an outer lead portion;
   electrically connecting each said inner lead portion to an input/output site on said electronic device;
   disposing said bonded electronic device and interconnect tape between base and cover components such that at least a portion of each said outer lead portion extends beyond said base component and said cover component; and
   simultaneously bonding by adhesively sealing both said base component and said cover component to said interconnect tape thereby encapsulating said electronic device.

2. The method of claim 1 wherein said base component is metal and said cover component is selected from the group consisting of metals, ceramics and polymers.

3. The method of claim 2 wherein a thermosetting polymer is selected to adhesively seal both said base component and said cover component.

4. The method of claim 3 wherein said thermosetting polymer is selected to be an epoxy having a cure temperature of less than about 200° C.

5. The method of claim 3 including the step of bonding said electronic device to either said base component or to said cover component with a die attach.

6. The method of claim 5 wherein said die attach is selected to bond at a temperature about equal to the cure temperature of said thermosetting polymer.

7. The method of claim 6 wherein said die attach is selected to be a thermally conductive material selected from the group consisting of solders, metal filled polymer adhesives and metal filled sealing glasses.

8. The method of claim 7 including selecting said base component from the group consisting of copper, aluminum and alloys thereof.

9. The method of claim 8 including selecting said base component to be an aluminum alloy and anodizing at least those surfaces exposed to the environment.

10. The method of claim 9 wherein said anodization layer is also disposed between said die attach and said base component.

11. The method of claim 10 wherein said cover component is selected to be an aluminum alloy and anodizing at least those surfaces exposed to the environment.

12. The method of claim 10 wherein said interconnect tape comprises at least one conductive copper or dilute copper alloy layer bonded to at least one dielectric support layer.

13. The method of claim 12 including the step of depositing a coating layer on that portion of said conductive layer which contacts said thermosetting adhesive.

14. The method of claim 13 including selecting said coating layer from the group consisting of gold, tin, nickel, their alloys and polymers.

15. The method of claim 14 including selecting said coating layer to be tin or a tin based alloy.

16. The method of claim 12 including the step of forming heat dissipating fins in said package base component.

17. The method of claim 6 wherein said electronic device is bonded to either said base component or to said cover component with said die attach at the same time said base component is bonded to said cover component.

* * * * *